United States Patent [19]
Nishiyama

[11] Patent Number: 5,337,010
[45] Date of Patent: Aug. 9, 1994

[54] WIDE-BAND AMPLIFIER APPARATUS

[75] Inventor: Seiichi Nishiyama, Kanagawa, Japan

[73] Assignee: Sony Corporation, Tokyo, Japan

[21] Appl. No.: 9,667

[22] Filed: Jan. 27, 1993

[30] Foreign Application Priority Data

Jan. 31, 1992 [JP] Japan .................................. 4-041923
Mar. 23, 1992 [JP] Japan .................................. 4-095825

[51] Int. Cl.$^5$ .............................................. H03F 3/45
[52] U.S. Cl. .................................... 330/255; 330/311
[58] Field of Search ............... 330/252, 255, 256, 307, 330/311

[56] References Cited

U.S. PATENT DOCUMENTS

4,323,854  4/1982  Hester .................. 330/256
4,928,073  5/1990  Arai et al. .............. 330/311 X

Primary Examiner—James B. Mullins
Attorney, Agent, or Firm—Hill, Steadman & Simpson

[57] ABSTRACT

In a wide-band amplifier circuit, a third and a fourth transistors are cascaded externally with a first and a second transistors within an integrated circuit which are connected each to output terminals by collectors through the output terminals, and a collector current flowing in the third transistor is transformed into an output voltage by an external resistance. A load capacity parasitic on the output terminal of the integrated circuit is driven by the collector current, thus a possibility of a frequency characteristic deteriorating due to an influence of the load capacity is avoided, and an operating zone can further be expanded to a high frequency band as compared with a prior art one.

8 Claims, 10 Drawing Sheets

WIDE-BAND AMPLIFIER APPARATUS

FIELD OF THE INVENTION

This invention relates to a wide-band amplifier apparatus, and more particularly to an improvement of a low power-consuming wide-band amplifier apparatus incorporated in an integrated circuit.

BACKGROUND OF THE INVENTION

Figure 1:
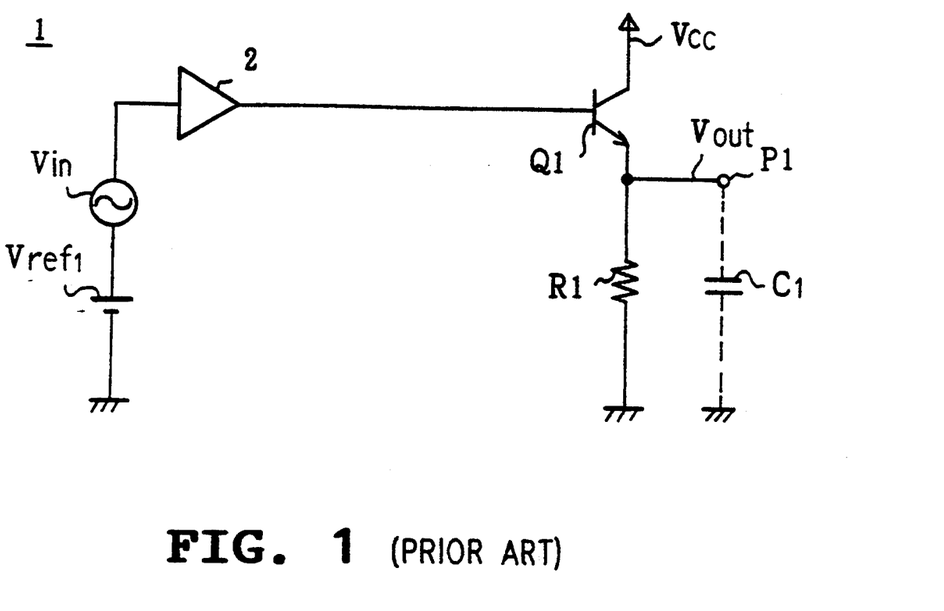
FIG. 1 is a wiring diagram illustrating a conventional emitter follower wide-band amplifier circuit.

As an emitter-grounded wide-band amplifier circuit 1, generally used hitherto is that of a construction in which, as shown in FIG. 1, an input signal $V_{in}$ amplified through an amplification stage 2 is inputted to an NPN transistor Q1, and is generated as an output signal $V_{out}$ from a load resistance R1 connected to an emitter of the transistor Q1.

Figure 2:
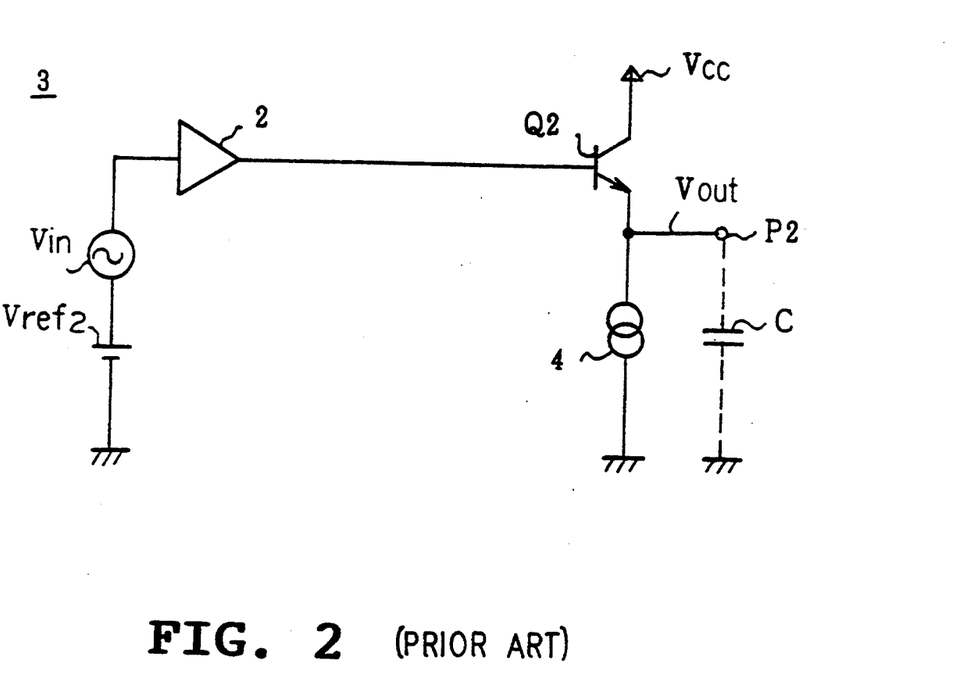
FIG. 2 is a wiring diagram illustrating a conventional emitter follower wide-band amplifier circuit.

Another conventional emitter-grounded wide-band amplifier circuit includes a wide-band amplifier circuit 3 with a current source 4 connected, as shown in FIG. 2, instead of the resistance R1 (shown in FIG. 1), which is functional to enhance a driving power of a load capacity during the period in which the output signal $V_{out}$ breaks, and thus to expand further a frequency characteristic.

However, in the case of the wide-band amplifier circuits 1 and 3, a total load capacity such as capacities $C_1$ and $C_2$ of pins applied to the output stage, capacities of pads and the like must be driven, therefore the problem inherent therein is such that a frequency characteristic is capable of deteriorating due to an influence of a damping resistance connected to the base for prevention of oscillations by the load capacity.

Figure 3:
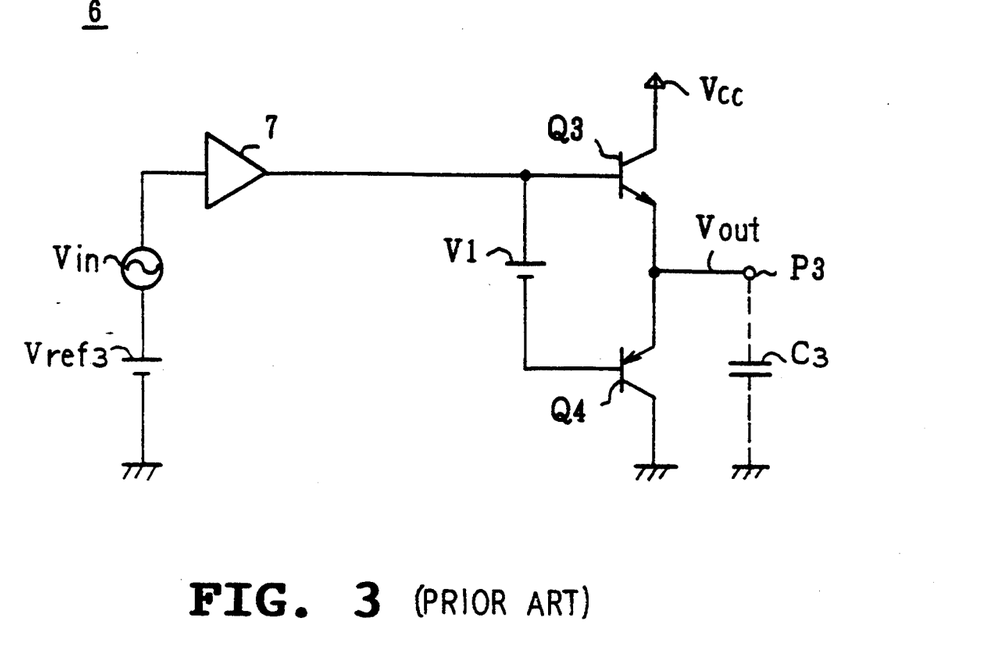
FIG. 3 is a wiring diagram illustrating a conventional complementary push-pull wide-band amplifier circuit.

Now, therefore, proposed is a wide-band amplifier circuit 6 with the output stage given in a push-pull construction so that the matter of oscillations may not particularly be taken into consideration (FIG. 3).

However, in the case of the wide-band amplifier circuit 6, since a transition frequency $f_T$ (gain being 1) of a PNP transistor Q4 connected to the transistor Q3 is generally low, a frequency characteristic cannot be expanded up to a high level.

Figure 4:
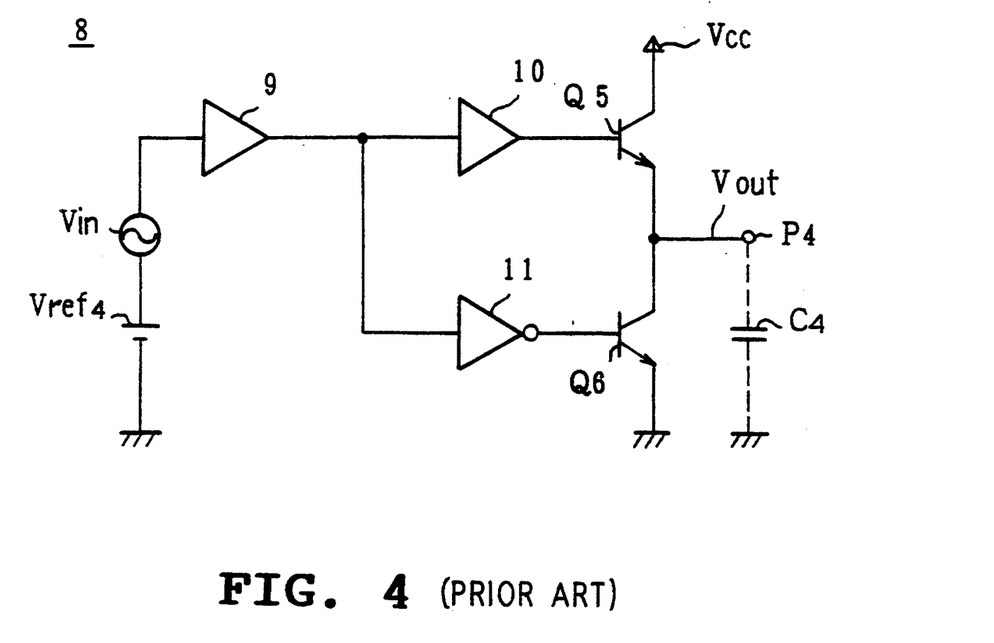
FIG. 4 is a wiring diagram illustrating a conventional wide-band amplifier circuit having a construction of NPN transistor.

Similarly, that with the output stage in a push-pull construction includes a wide-band amplifier circuit 8 for subjecting transistors Q5 and Q6 to a push-pull operation from inputting the input signal $V_{in}$ amplified through an in-phase amplifier circuit 10 and an inverse amplifier circuit 11 to the NPN transistors Q5 and Q6 constructing a single ended push-pull output stage ( FIG. 4 ).

In the case of the wide-band amplifier circuit 8, however, a phase difference of the output signal cannot be adjusted at 180° for the difference in delay time between the amplifier circuit 10 and 11, therefore the frequency characteristic cannot be expanded unlimitedly, and hence it cannot be applied to a wide-band amplifier circuit operating on the input signal $V_{in}$ exceeding, for example, 100 [MHz].

Figure 5:
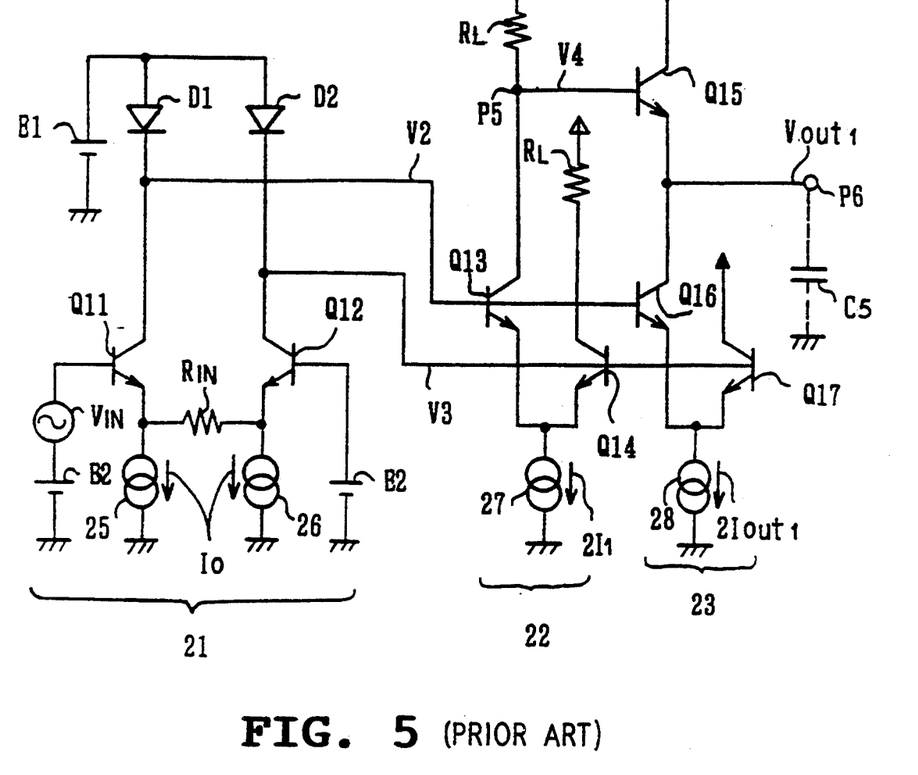
FIG. 5 is a wiring diagram illustrating a conventional differential wide-band amplifier circuit.

In view of such circumstances, there is proposed a wide-band amplifier 20 as shown in FIG. 5, whereby a frequency characteristic may be expanded to a high band not less than 200 [MHz].

The wide-band amplifier circuit 20 then comprises a differential input stage 21 and two differential output stages 22 and 23 connected in parallel with the output signal thereof, and the differential input stage 21 is constructed of a pair of NPN transistors Q11 and Q12.

Here, the emitters of the transistors Q11 and Q12 of the differential input stage 21 are connected to current sources 25 and 26 leading in a constant current $I_O$, and an input resistance $R_{in}$ is connected to nodes whereat the emitters and the current sources 25 and 26 are connected together.

Further, diodes D1 and D2 having a reference potential E1 given to other ends are connected to collectors of the transistors Q11 and Q12, and a anti-phase output signal V2 and an in-phase output signal V3 of the input signal $V_{in}$ are generated to differential output stages 22 and 23 from the nodes whereat these are connected.

On the other hand, the differential output stage 22 has a differential pair constructed of a pair of NPN transistors Q13 and Q14, and a current source 27 leading in a constant current $2I_1$ is connected to a common emitter of the transistors.

The load resistance $R_L$ is connected to collectors of the transistors Q13 and Q14, and the differential output stage 22 comprises generating an in-phase output signal V4 having inversed the anti-phase output signal V2 to a buffer transistor Q15.

As in the case of the differential output stage 22, the differential output stage 23 has a differential pair constructed of a pair of NPN transistors Q16 and Q17, and a current source 28 leading in an output current $2I_{out1}$ is connected to a common emitter of the transistors.

In this case, collectors of the transistors Q16 and Q17 are connected to an emitter of the buffer transistor Q15 and a collector of the transistor Q14 respectively, and the transistor Q16 constructs a low-impedance signal push-pull output stage with the buffer transistor Q15.

In this connection, a transfer function $G(S_1)$ of the wide-band amplifier circuit 20 may be expressed as:

$$G(S_1) = \frac{R_L \times I_1}{R_{IN} \times I_0} \cdot \frac{1}{1 + j(f/f_c)} \quad (1)$$

by means of a cut-off frequency $f_c$.

Thus, the buffer transistor Q15 and the transistor Q16 drive the load capacity $C_5$ on voltage in accordance with the in-phase output signal V4, and also drive it on current in accordance with the anti-phase output signal V2 anti-phase with the in-phase output signal V4, therefore the frequency characteristic can further be expanded as compared with the case of other wide-band amplifier circuits 1, 3, 6 and 8.

As a result, the wide-band amplifier circuit 20 is capable of obtaining an output amplitude 4 $[V_{p-p}]$ in a high band of 250 [MHz] or so without using a transistor particularly high in the transition frequency $f_T$, however, it is conceived that a serviceability will further be enhanced, if a large amplitude of output signal can be generated with the frequency characteristic remaining as constant, or the frequency characteristic can be further expanded with the amplitude as constant.

Further, an integratized wide-band amplifier circuit has another problem which effects frequency deterioration.

That is, an output stage of an integrated circuit is generally constructed of an emitter follower output circuit as shown in FIGS. 1 and 2, generating an output signal $V_{out}$ from output pins P1 and P2.

Here, in the output stage of an integrated circuit 1 (FIG. 1), an NPN transistor Q1 is driven by an input signal $V_{in}$ amplified by an operational amplifier 2, and the output voltage $V_{out}$ generated on a load resistance R1 connected to an emitter of the transistor Q1 is outputted from the output pin P1.

In an output stage of an integrated circuit 3 (FIG. 2), the emitter of the NPN transistor Q2 is connected to a current source 4 to drive the transistor Q2 with a constant current, and output the output voltage signal $V_{out}$ from the output pin P2.

Meanwhile, there exists a load capacity C2 such as a pin capacity (4 to 5 pF), a pad capacity, a capacity of external parts and the like on the output stage of the integrated circuit, and since the output stage must drive the load capacity C2 with the output voltage signal $V_{out}$, a frequency characteristic cannot be enhanced full to a high level.

For example, the output stage of the integrated circuit 1 and the integrated circuit 3 is constructed of an emitter follower circuit, therefore a current amplification factor $h_{FE}$ drops inevitably in a high frequency band. As a result, an output impedance gets high and the circuit tends to oscillate, and thus a resistance must be connected to a base of the transistors Q1 and Q2 to suppress the oscillation.

Thus in the case of the integrated circuit 1 and the integrated circuit 3, a frequency characteristic can only be enhanced to 40 to 50 [MHz] or so.

Now, therefore, it is possible to conceive of the output stage being given in a push-pull circuit configuration for driving the load capacities C1 and C2 (FIGS. 3 and 4).

However, in the case of the output stage of an integrated circuit 6 (FIG. 3), while the frequency characteristic can be enhanced as compared with the integrated circuit 1 and the integrated circuit 3, the frequency characteristic can only be enhanced as high, at best, as 150 [MHz] due to an influence of a low transition frequency $f_T$ of a PNP transistor Q4 constructing the push-pull circuit.

On the other hand, in the case of the output stage of an integrated circuit 8 (FIG. 4), the construction is such that the NPN transistors Q5 and Q6 are connected in series, a buffer circuit 10 and an inversion buffer circuit 11 are connected to bases of the transistors Q5 and Q6 respectively, thereby subjecting the output stage to a push-pull operation, however, the frequency characteristic cannot be enhanced satisfactorily to a high level to a difference in delay time between the buffer circuit 10 and the inversion buffer circuit 11.

SUMMARY OF THE INVENTION

In view of the foregoing, an object of first aspect of this invention is to provide a wide-band amplifier circuit apparatus capable of extending a dynamic range as compared with the prior art and also expanding a frequency characteristic further to a high band.

An object of second aspect of this invention is to provide a wide-band amplifier circuit in an IC package, when expanding a frequency characteristic further to a high band.

DETAILED DESCRIPTION OF THE INVENTION

Figure 6:
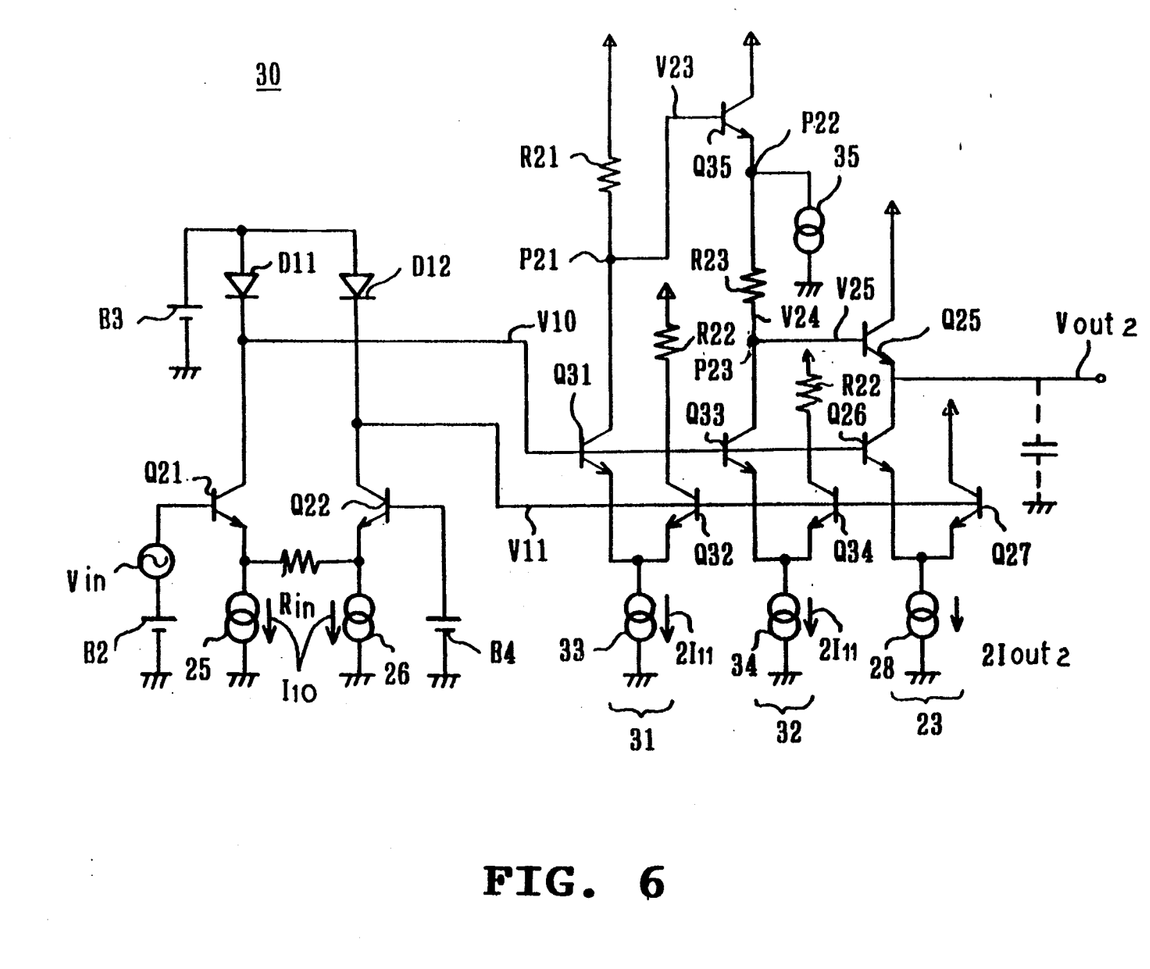
FIG. 6 is a wiring diagram illustrating a wide-band amplifier circuit of first embodiment of the present invention.

Preferred embodiments of this invention will be described with reference to the accompanying drawings:

In FIG. 6, 30 indicates first embodiment of a wide-band amplifier circuit as a whole, which has a like construction of FIG. 5 with the exception of that the differential output stage 31 and 32 are connected in parallel with the differential output stage 23.

Here the differential output stage 31 has a differential pair constructed of a pair of NPN transistors Q31 and Q32, and the anti-phase output signal V10 and the in-phase output signal V11 are inputted to the bases.

Then, a current source 33 is connected to the common emitters of the transistors Q31 and Q32, and the emitter current $2I_{11}$ is led in from the transistors Q31 and Q32.

Here, load resistances R21 and R22 with a value $R_L/2$, half of the resistance value $R_L$ prevailing hitherto, are connected to collectors of the transistors Q31 and Q32 respectively.

Thus, the load resistance R21 is ready for generating the in-phase output signal V23 with a gain half of the in-phase output signal V4 (in FIG. 5) operating hitherto a rear stage.

On the other hand, the differential output stage 32 has a differential pair constructed of a pair of NPN transistors Q33 and Q34 as in the case of the differential output stage 31, and the anti-phase output signal V10 and the in-phase output signal V11 are inputted to the bases.

Further, a current source 34 is connected to common emitters of the transistors Q33 and Q34, and the output current $2I_{11}$ is led in therefrom as in the case of differential output stage 31.

Here, the load resistance R23 having a value $R_L/2$, half of the resistance value $R_L$ prevailing hitherto, is connected, like the load resistance R21, to a collector of the transistor Q33.

An emitter of the emitter-grounded buffer transistor Q35 is connected to another end of the load resistance R23, and the in-phase output signal V23 generated on the load resistance R21 and supplied through a node P21 in a front stage is added to the output signal V24 generated on the load resistance R23.

Thus, the combined output signal V25 with an amplitude the same as in the case of wide-band amplifier circuit 20 is generated from a node P23 whereat the load resistance R23 and the transistor Q33 are connected together to a base of the buffer transistor Q25 on a rear stage.

Since resistance values of the load resistances R21 and R23 are half of those prevailing hitherto in this case, a cut-off frequency of each of the differential output stages 31 and 32 can be expanded twice.

In this connection, a current source 35 is connected to a node P22 whereat the buffer transistor Q35 and the load resistance R23 are connected together.

Further, the current source 28 connected to common emitters of the transistors Q26 and Q27 of the differential output stage 23 on a final output stage has the output current $2I_{out2}$ given by the following $$2I_{out2} > I_{min} = \pi \cdot f_{max} \cdot V_{p-p} \cdot C \quad (2)$$

led therein.

Here, a current amount $I_{min}$ is an output current amount necessary at the least for generating an output signal having a frequency $f_{max}$, an output amplitude being $V_{p-p}$ and a setting time being $t_{min}$, and is obtainable through the following relational expressions:

$$\pi \cdot f_{max} \cdot V_{p-p} = SR \quad (3)$$

$$\frac{I_{min}}{C} = \frac{V_{p-p}}{t_{min}} = SR \quad (4)$$

In the case of this embodiment, the idling current $I_{out2}$ ($>I_{min}/2$) flowing through the transistors Q26 and Q27 connected to the current source 28 may be half of the output current $2I_{out2}$, therefore the transistors Q26 and Q27 can be constructed of transistors with the driving ability coming not more than half of conventional ones.

Thus, the capacitance which is parasitic on the transistors Q25 and Q26 driving the load capacity C can be minimized not more than half of the conventional one, and a total load capacity is reasonably reduced to withstand oscillations satisfactorily, therefore a frequency characteristic can be enhanced furthermore.

In the aforementioned construction, when the input signal $V_{in}$ is inputted to the differential input stage Q21, the wide-band amplifier circuit 30 generates a differential output of the input signal $V_{in}$ to the differential output stages 31, 32 and 23 from the differential input stage 21 as the anti-phase output signal V10 and the in-phase output signal V11.

Figure 7:
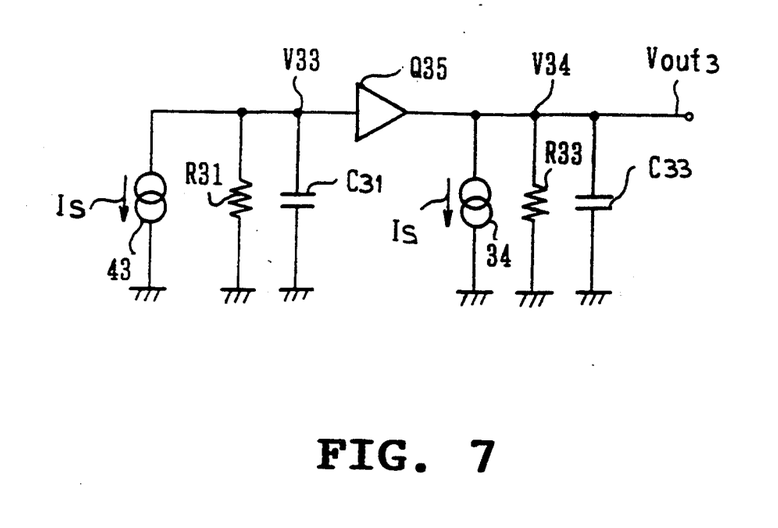
FIG. 7 is a wiring diagram illustrating an equivalent circuit of the wide-band amplifier circuit shown in FIG. 6.

In this case, if the wide-band amplifier circuit 30 is indicated by an AC equivalent network, then, as shown in FIG. 7, the circuit may be regarded as having the load resistances R31 and R33, and the collector capacities C31 and C33 of the transistors Q31 and Q33 connected in parallel on the input side and the output side of the buffer transistor Q35.

Here, the load resistances R31 and R33 have an amplitude given by the following equation:

$$V33 = V34 = \frac{1}{2} \cdot \frac{R_L \times I_1}{R_{IN} \times I_0} \quad (5)$$

and the in-phase output signals V33 and V34 in-phase with each other are generated.

Consequently, an output of the amplitude resultant from adding the in-phase output signals V33 and V34, namely doubling, is obtained on the final output stage, and a total gain G of the wide-band amplifier circuit 30 becomes even in value as the case of the prior art wide-band amplifier circuit 20.

On the other hand, in FIG. 6, from using a relation wherein a cut-off frequency of the differential output stages 31 and 32 is twice ($2f_c$) the conventional cut-off frequency $f_c$ with resistance values of the load resistances R21 and R23 being half of the conventional ones, a transfer function $G(S_2)$ of the wide-band amplifier circuit 30 may be expressed by the following equation:

$$G(S_2) = \frac{R_L \times I_{11}}{R_{IN} \times I_{50}} \quad (6)$$

$$= \left( \frac{1}{1 + j(f/2f_c)} \cdot \frac{1}{1 + j(f/2f_c)} \cdot \frac{1}{1 + j(f/2f_c)} \right)$$

Now, therefore, when the frequency f satisfies the following equation:

$$\left| \frac{1}{1 + j(f/2f_c)} \cdot \frac{1}{1 + j(f/2f_c)} \cdot \frac{1}{1 + j(f/2f_c)} \right| = \frac{1}{2} \quad (7)$$

a cut-off frequency $f_c$ of the wide-band amplifier circuit 30 according to the invention will be obtained.

In this case, the cut-off frequency $f_c$ of the wide-band amplifier circuit 30 becomes $\sqrt{2}$ times as high as the conventional cut-off frequency $f_c$.

Thus, the wide-band amplifier circuit 30 is capable of expanding a frequency characteristic further to a high band as compared with the prior art one.

According to the above-described construction, from constructing a single ended push-pull output stage forming the final output stage of the buffer transistor Q25 and the transistor Q26 of the differential output stage 23, and driving the single ended push-pull output stage on the output signals V25 and V10 anti-phase with each other, a deterioration of the frequency characteristic in a high frequency band is avoided, the differential outputs V23 and V24 with a signal amplitude ½ of the output signal V25 are combined through the buffer transistor Q35, and from driving an output end by means of the combined output signal V25, a cut-off frequency in the two differential output stages 31 and 32 can be expanded twice the conventional one, and the general cut-off frequency $f_c$ of the wide-band amplifier circuit 30 can also be expanded $\sqrt{2}$ times as high as the conventional one.

In the above-described embodiment, while the description has referred to the case where resistance values of the load resistances R21 and R23 of the differential output stages 31 and 32 are adjusted to ½ of the load resistance value $R_L$ of the prior art wide-band amplifier circuit 20, the present invention is not necessarily limited thereto, and these may be set even at a resistance value of the load resistance $R_L$.

In this case, while only the same frequency characteristic as the prior art wide-band amplifier circuit 20 is obtained, output amplitudes of the load resistances R21 and R23 become double of conventional ones, and the general gain G of the wide-band amplifier circuit 30 may be enhanced $\sqrt{2}$ times as high as the conventional one.

Thus even in case the collector capacity of the NPN transistor becomes inevitably large, a satisfactory output amplitude may be obtained.

Figure 8:
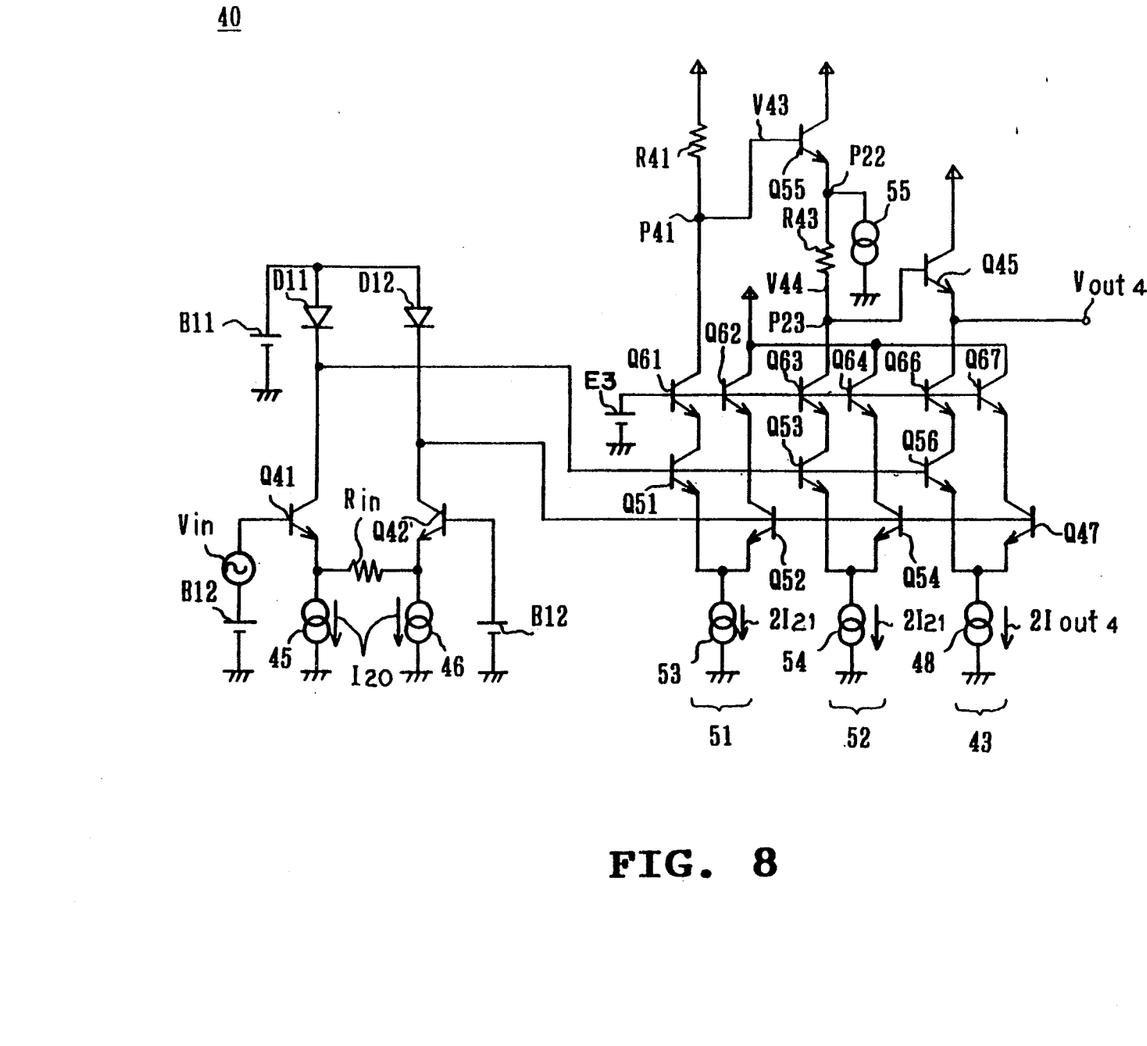
FIG. 8 is a wiring diagram illustrating a wide-band amplifier circuit of second embodiment of the present invention.

The second embodiment of the present invention will be next explained with reference to FIG. 8.

In the above-described embodiment, the description has referred to the case where the wide-band amplifier circuit is constructed as shown in FIG. 6, however, the present invention is not necessarily limited thereto, and the invention may be applied extensively to the case where the NPN transistors Q61 and Q62 (Q63 and Q64, Q66 and Q67) are cascaded respectively with the transistors Q51 and Q52 (Q53 and Q54, Q56 and Q47) constructing the differential output stages 51 (52, 53).

Thus a wide-band amplifier circuit 40 (hereinafter called cascaded connection type) is capable of decreasing an influence of Miller capacity furthermore, and hence capable of expanding a frequency characteristic further to a high band.

A third embodiment of this invention will be described with reference to FIG. 9.

Figure 9:
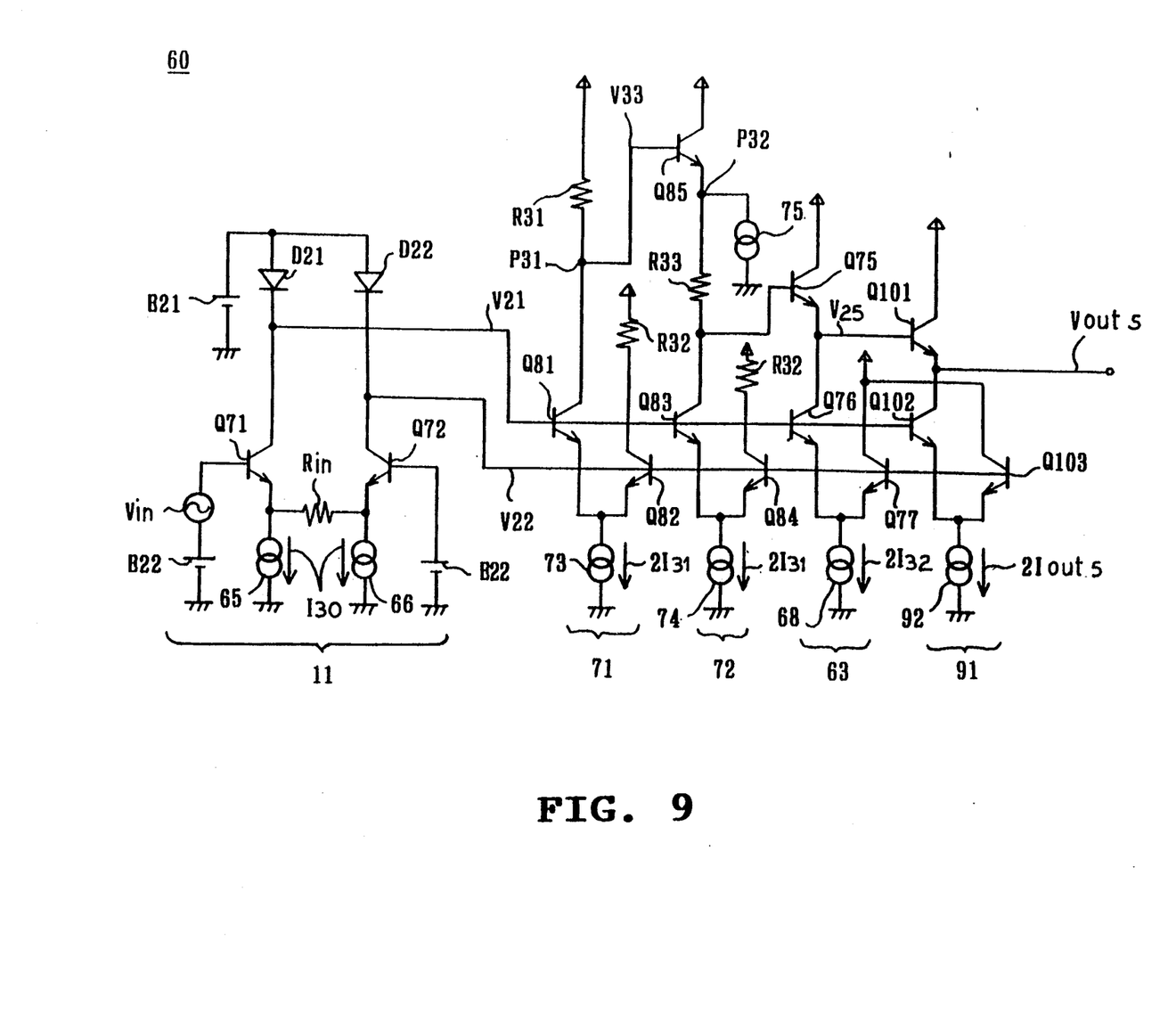
FIG. 9 is a wiring diagram illustrating a wide-band amplifier circuit of third embodiment of the present invention.

In the above-described embodiment, the description has referred to the case where the wide-band amplifier circuit is constructed as shown in FIG. 6, however, the present invention is not necessarily limited thereto, and hence is applicable to the case, as shown in FIG. 9, where the third differential output stage 91 is provided on a rear stage of the second differential output stage 63, and the differential output V25 of the differential output stage 63 is supplied to the buffer transistor Q101 subjected to Darlington connection with the buffer transistor Q75.

Here, the anti-phase output signal V21 and the in-phase output signal V22 are supplied respectively to bases of the transistors Q102 and Q103 constructing the differential output stage 91.

Further, collector currents into which the output current $2I_{out5}$ is divided internally of the current source 92 in a voltage ratio of the anti-phase output signal V21 and the in-phase output signal V22 are supplied each to the transistors Q102 and Q103.

From having the buffer transistor Q75 and the buffer transistor Q101 subjected to Darlington connection, a wide-band amplifier circuit 60 (hereinafter called Darlington connection type) is capable of supplying a much larger collector current than ever before to the final output stage, thus expanding a frequency characteristic further to a high band.

A fourth embodiment of this invention will be subsequently described with reference to FIG. 10.

Figure 10:
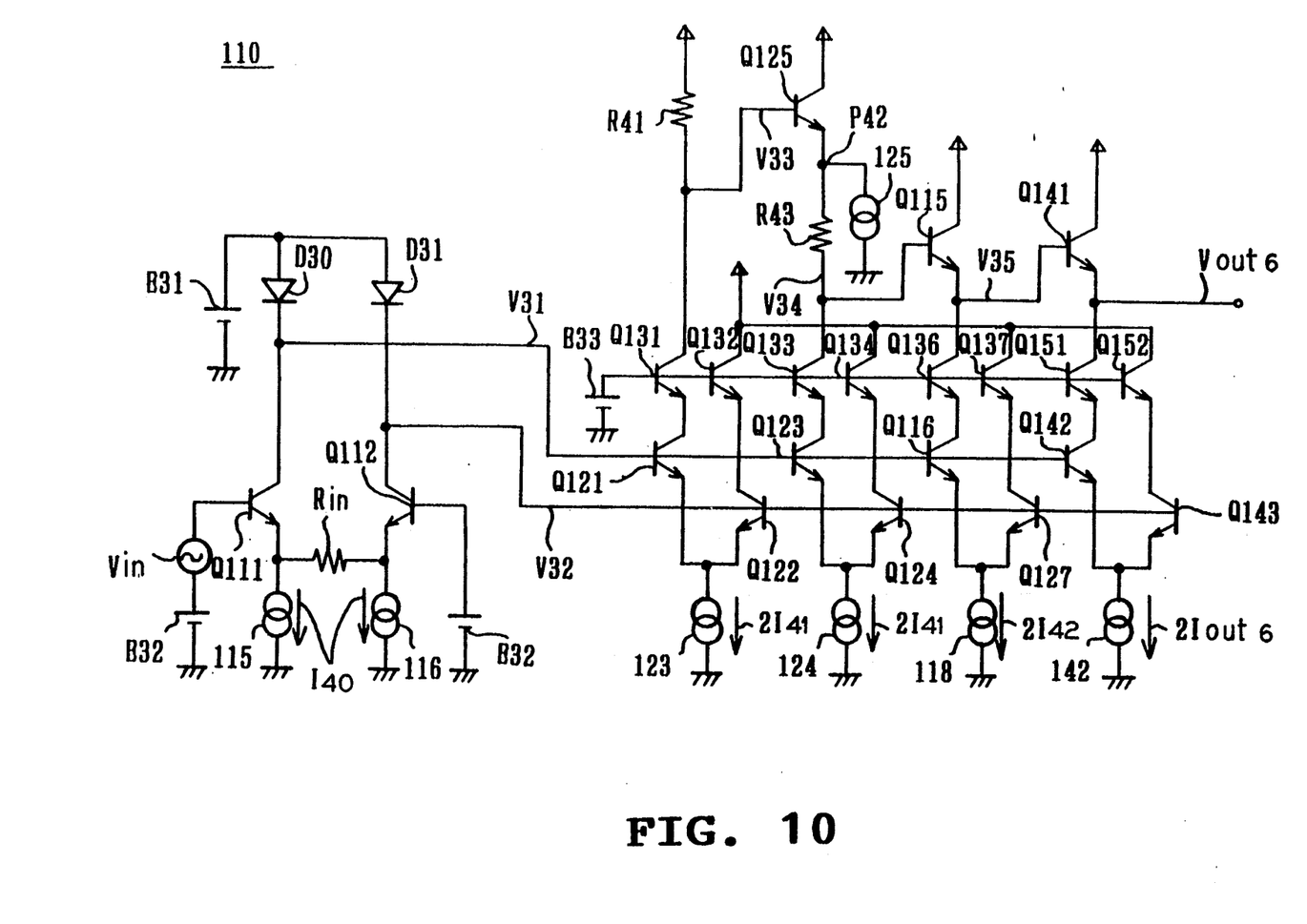
FIG. 10 is a wiring diagram illustrating a wide-band amplifier circuit of fourth embodiment of the present invention.

Further, the above-described embodiment, the description has referred to the case where the wide-band amplifier circuit is constructed as shown in FIG. 6, the present invention is not necessarily limited thereto, and as shown in FIG. 10, the invention is applicable to the case of a wide-band amplifier circuit 110 for which the cascaded connection type and the Darlington connection type are combined together.

Thus the wide-band amplifier circuit 110 is capable of expanding a frequency characteristic furthermore as compared with the prior art one.

A fifth embodiment of this invention will be described with reference to FIG. 11.

In the above-described fourth embodiment in FIG. 10, the description has referred to the case where the current sources 118, 123, 124 and 142 are connected to the transistors for differential output stages Q116, Q121, Q123 and Q142 respectively, however, the present invention is not necessarily limited thereto, and hence resistances may be connected otherwise thereto.

Figure 11:
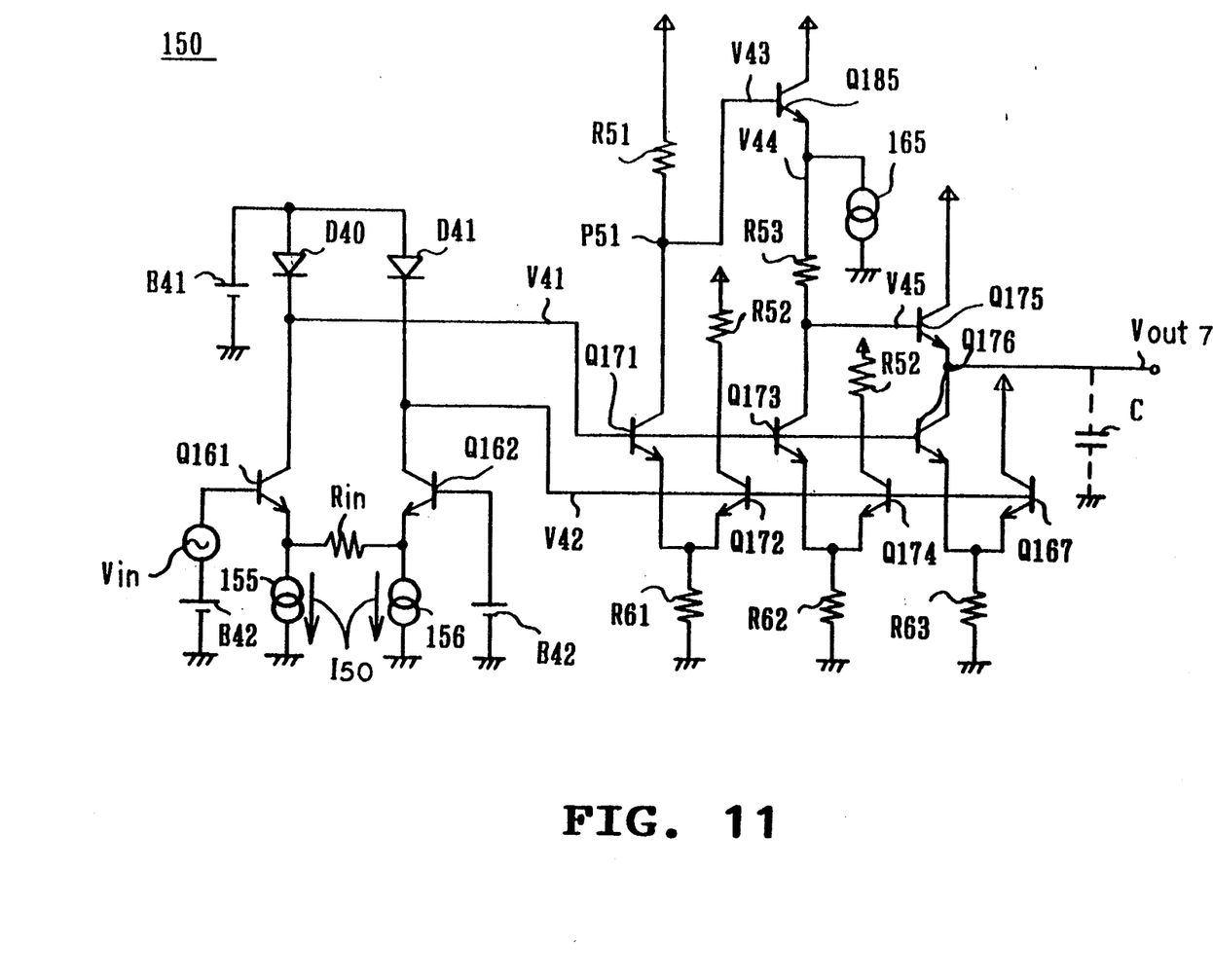
FIG. 11 is a wiring diagram illustrating a wide-band amplifier circuit of fifth embodiment of the present invention.

In the case of FIG. 11, for example, the resistances R61 (R62, R63) may be connected to a common emitters of the transistors Q171 and Q172 ( Q173 and Q174, Q176 and Q167).

In this connection, resistance values of the resistances R61 and R62 are set equally to each other.

Thus, a wide-band amplifier circuit 150 can be constructed of elements much less number than the prior art one, and a power consumption can further be reduced.

In this case the gain G of the wide-band amplifier circuit 150 indicates a value for which a gain of the output signal of the load resistance R53 is added to a gain of the output signal of the load resistance R51, and is given by the following equation:

$$G = \frac{R_L}{R_{IN}} \cdot \frac{E/R_{61}}{I_0} \quad (8)$$

Further in the above-described embodiment, the description has referred to the case where the input signal $V_{in}$ is inputted only to the transistor Q161 of the differential input stage 11, however, the present invention is not necessarily limited thereto, and thus the invention is also applicable to the case where input signals $V_{in}$ anti-phase with each other are inputted to the transistors Q161 and Q162.

Consequently, a gain of the output signal $V_{out}$ can be selected double of the above-described embodiment.

As described above, according to the present invention, the in-phase output signal and the anti-phase output signal are supplied in parallel to the first, second and third differential output stages from the differential input stage, a combined output voltage obtained from superposing the first differential output generated from the first differential output stage on the second differential output of the second differential output stage through the first buffer transistor is supplied to the output end, and from subjecting the output end to a push-pull drive on the combined output voltage and the output current anti-phase with each other, a deterioration of a frequency characteristic due to a phase shift of both signals can be avoided effectively, and a dynamic range of the output signal can be expanded further.

A sixth embodiment of this invention will be described with reference to FIG. 12.

Figure 12:
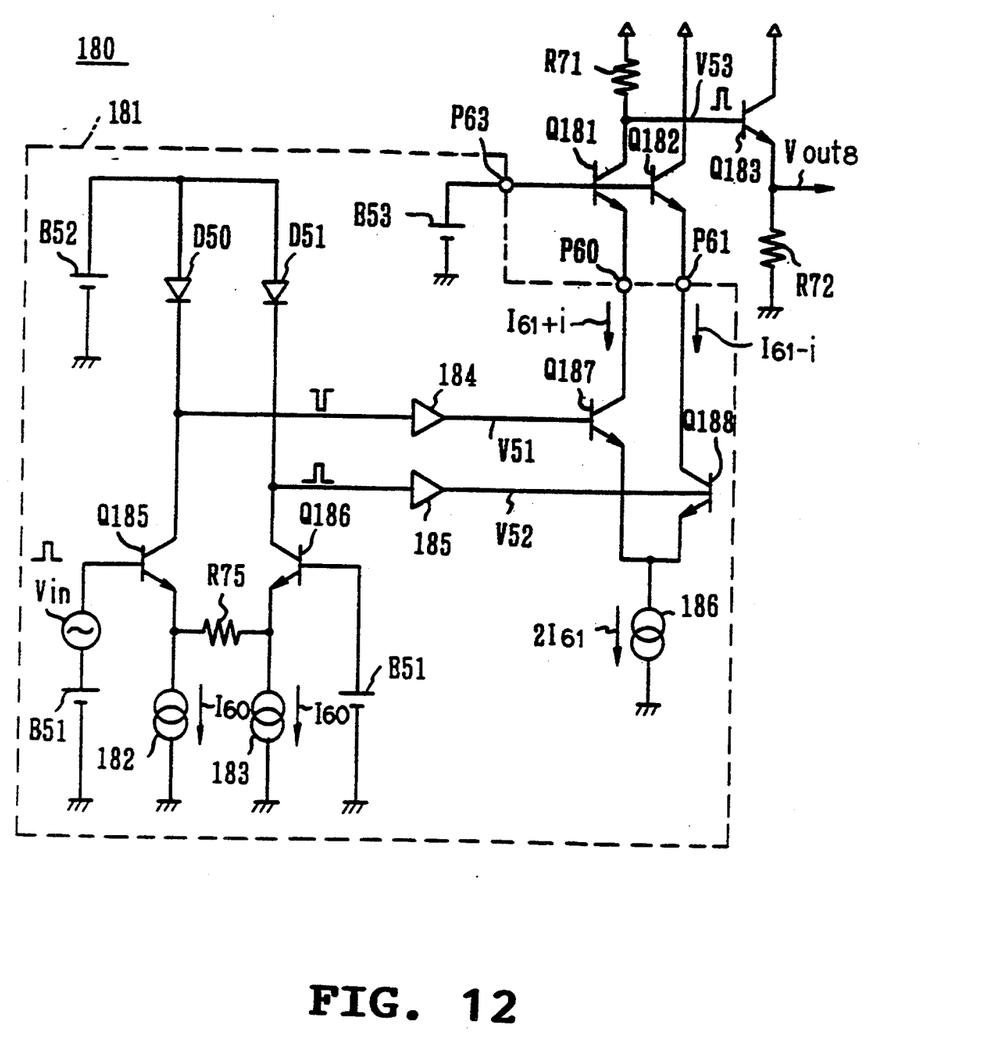
FIG. 12 is a wiring diagram illustrating a wide-band amplifier circuit of sixth embodiment of the present invention.

In FIG. 12, 180 indicates an output circuit, which comprises taking an output from an output stage as a current output instead of a voltage output working hitherto by employing Gilbert type operational amplifier circuit incorporated in the integrated circuit 181, and extracting the output voltage $V_{out8}$ through the NPN transistor Q181 connected externally and the external load resistance R71.

Here, the Gilbert type operational amplifier circuit is constructed of a pair of NPN transistors Q185 and Q186, the input signal $V_{in}$ superposed on the bias voltage E51 is supplied to a base of the transistor Q185, and the bias voltage E51 is supplied to a base of the transistor Q186.

Current sources 182 and 183 are connected to emitters of the transistors Q185 and Q186 respectively, and nodes whereat each emitter and the current sources 182 and 183 are connected are connected with each other through a load resistance R75.

Here, the current sources 182 and 183 supply a current $I_{60}$ having a temperature characteristic in inverse proportion to the temperature characteristic of the load resistance R75.

Further, diodes D50 and D51 are connected to collectors of the transistors Q185 and Q186 respectively, and an anti-phase output V51 and an in-phase output V52 subjected to a logarithmic compounding by the diodes D50 and D51 are supplied to the differential amplifier circuit on the rear stage as differential inputs through buffer amplifiers 184 and 185.

In this connection, a supply voltage E52 is supplied to other ends of the diodes D50 and D51.

Here, the differential amplifier circuit comprises a pair of NPN transistors Q187 and Q188, and is driven by the anti-phase output V51 and the in-phase output V52 inputted to bases of the transistors Q187 and Q188 respectively.

In this connection, the current source 186 is connected in common to emitters of the transistors Q187 and Q188, and a current $2I_{61}$ with less characteristic fluctuation irrespective of a fluctuation of working temperature is supplied thereto.

The transistors Q187 and Q188 are then cascaded respectively with the NPN transistors Q181 and Q182 provided externally of the integrated circuit 181 through the signal output terminals P60 and P61, Miller capacity can thus be decreased and a change in voltage amplitude may be extracted externally as a change in current amplitude.

The DC supply voltage E53 is supplied to bases of the transistors Q181 and Q182 through the power output terminal P63. Here, a pad capacity and a pin capacity of the integrated circuit 181 exist on the power output terminal P63 and the signal output terminals P60 and P61, however, since the power output terminal P63 is for outputting DC voltage, no influence will be exerted on the frequency characteristic.

A terminal voltage on the signal output terminals P60 and P61 is then kept substantially at $E_{53}-V_{BE}$ to provide only against a fluctuation of amplitude caused by an emitter resistance $r_e$ of the transistors Q181 and Q182 provided externally of the integrated circuit 181, and since an impedance is low besides, a possibility of the frequency characteristic deteriorating due to the load capacity on the terminal as is often the case hitherto can effectively be avoided.

Here, the external resistance R71 is connected to the collector of the NPN transistor Q181, and a supply voltage is supplied to the other end of the external resistance R71 from an external power source.

Thus, as controlling the supply voltage within the integrated circuit 181 to a low level, a logical output V53 with large logical amplitude is obtainable on the external resistance R71.

Further, a base of an NPN transistor Q183 is connected to a node whereat the external resistance R71 and the transistor Q181 are connected, and a voltage generated on a load resistance R71 by the logical output V53 in-phase with the input signal $V_{in}$ is generated as the output signal $V_{out8}$.

Here, since an influence of the load capacity of the output terminals P60 and P61 is minimized, a frequency characteristic of the output circuit 180 is determined by a collector capacity $C_{ob}$ of the external transistors Q181 and Q183 and a resistance Value $R_{71}$ of the external resistance R71, and thus is given by the following equation:

$$f_H = \frac{1}{2(2C_{ob})R_{71}} \quad (9)$$

In the above equation, the collector capacity $C_{ob}$ is 0.5 [pF], which is smaller by one digit than the load capacity C1 on the output terminal P60, therefore a frequency characteristic of the output circuit 180 can be expanded to a wide band as 250 [MHz] or more.

A preferred construction of the current sources 182 and 183 will be next described with reference to FIG. 13.

Figure 13:
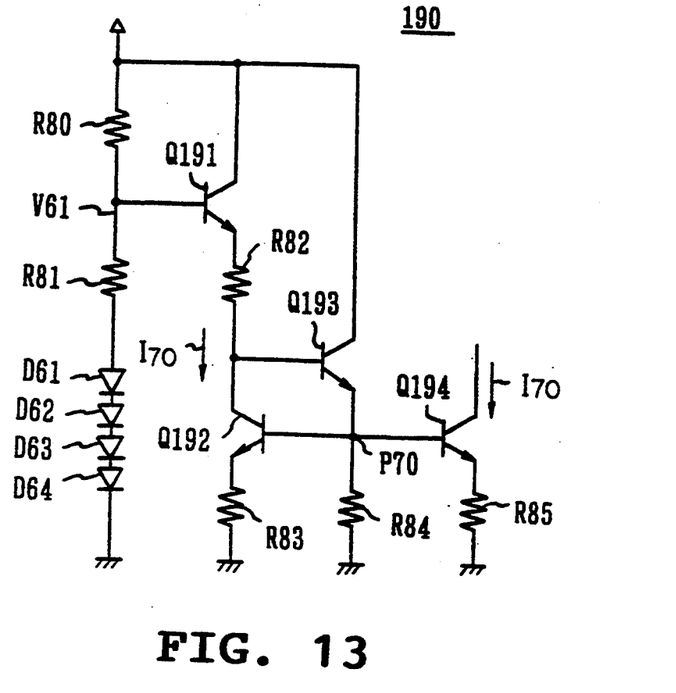
FIG. 13 is a wiring diagram illustrating a current source circuit 12 and 13 used in the wide-band amplifier circuit, shown in FIG. 12.

The current sources 182 and 183 of FIG. 12 may be constructed as a current source 190 shown in the FIG. 13. That is, the current source 190 has resistances R80 and R81 with the ratio of resistance values as 3:1, and a base of an NPN transistor Q191 is connected to a node whereat the resistances R80 and R81 are connected together.

Further, a level shift circuit constructed of diodes D61 to D64 is connected between the resistance R81 and a ground potential, and a voltage divided internally by the resistances R80 and R81 is supplied to the transistor Q191.

A resistance R82 is connected to an emitter of the transistor Q191, and the current I70 flows through an NPN transistor Q192 and a load resistance R83.

Further, a collector and a base of the transistor Q192 are connected to a base and a collector of an NPN transistor Q193 respectively, and a resistance R84 is connected to a node P70 whereat the base and the emitter are connected together with the other end grounded.

An NPN transistor Q194 has its base connected to the node P70 and also has its collector connected to one of the transistors Q185 and Q186 (in FIG. 12) constructing a differential pair of the Gilbert type operational amplifier circuit.

Here, a resistance R85 with the same resistance value as the resistance R83 is connected to an emitter of the transistor R194, and the same current value $I_{70}$ ($=I_{60}$ in FIG. 12) as the current value of the transistor Q192 flows thereto.

Here, the current value $I_{70}$ (or $I_{60}$) from the transistor Q191 to the transistor Q192 may be Given by the following relational expression:

$$(V_{CC} - 4V_{BE}) \cdot \frac{R_{81}}{R_{80} + R_{81}} + V_{BE} = (R_{82} + R_{83}) \cdot I_{70} \quad (10)$$

In the case of this embodiment, since the ratio of resistance values of the resistance R80 and the resistance R81 is 3:1, therefore as shown in the following equation:

$$V_{CC} \cdot \frac{1}{4} = (R_{82} + R_{83}) \cdot I_{70} \qquad (11)$$

$$I_0 = A \cdot \frac{1}{R_{82} + R_{83}} \qquad (12)$$

here, A is a constant, the current $I_{70}$ ($=I_{60}$) will be in inverse proportion to the internal resistance $R_{75}$ of the integrated circuit 181 (shown in FIG. 12).

Thus, a dynamic range $R_{75} \cdot I_{70}$ ($=I_{60}$) of an input signal given by the product of the internal resistance value $R_{75}$ and the current value $I_{70}$ ($=I_{60}$) may be kept substantially constant irrespective of a fluctuation of working temperature.

A preferred construction of current source 186 (of FIG. 12) will be next described.

Figure 14:
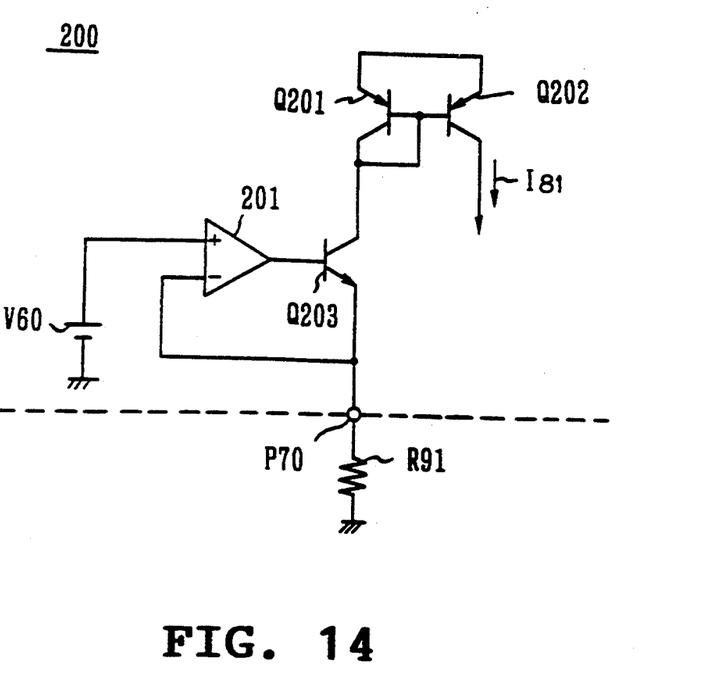
FIG. 14 is a wiring diagram illustrating a current source circuit 16 used in the wide-band amplifier circuit shown in FIG. 12.

The current source 186 (of FIG. 12) comprises, as shown in FIG. 14 as a current source 200, PNP transistors Q201 and Q202, an operational amplifier 201 and a buffer transistor Q203 construct a current Miller constant current circuit.

Here, a reference voltage $V_{60}$ stable irrespective of a fluctuation of working temperature is supplied to a non-inversional input end of the operational amplifier 201 from a band gap circuit, and an output of the buffer transistor Q203 is fed back to an inversional input end thereof.

Further, an external resistance R91 free from temperature dependent characteristic is connected to an emitter of the buffer transistor Q203, thus allowing the current value $I_{81}$ ($=I_{61}$) of the collector current of the transistor Q202 (i.e. the transistor Q188 of FIG. 12) free from temperature dependence to flow which is given by the following equation:

$$I_{81} = \frac{V_{60}}{R_{91}} \qquad (13)$$

Thus, the current source 200 is capable of supplying the current $I_{61}$ ($=I_{81}$) free from temperature dependence to the transistors Q187 and Q188 (shown in FIG. 12) constructing a differential pair, and hence ensuring a general gain G of the output circuit 180 irrespective of a temperature fluctuation.

In the above-described construction, when the input signal $V_{in}$ is amplified through a Gilbert type operational amplifier circuit constructed of a pair of NPN transistors Q185 and Q186, the integrated circuit 181 (FIG. 12) supplies the anti-phase output V51 and the in-phase output V52 of the input signal $V_{in}$ to bases of the transistors Q187 and Q188 connected to the output terminals P60 and P61 respectively.

In this case the integrated circuit 181 transforms the anti-phase output V51 and the in-phase output V52 into a current output on the transistors Q187 and Q188 constructing an output stage of the integrated circuit, and controls the collector current ($I_{61} \pm i$) flowing in the external resistance R71 through the output pin P60.

Meanwhile, since emitter potentials of the external transistors Q181 and Q182 are provided, terminal voltages on the output terminals P60 and P61 are substantially constant irrespective of a fluctuation of the output current.

Thus the impedance gets low, the frequency characteristic is obtained through equation (9) in accordance with the collector capacity $C_{ob}$ of the external transistors Q181 and Q183 and the external resistance R71 regardless of the 5 [pF] load capacity C, and thus the frequency characteristic can be expanded strikingly to 250 [MHz] or so as compared with the prior art one.

When a presence of an emitter resistance $r_e$ of the transistors Q185 and Q186 is neglected, the general gain G of the output circuit 180 may be obtained through the following equation:

$$G = \frac{R_{71}}{R_{75}} \cdot \frac{I_{61}}{I_{60}} \qquad (14)$$

in accordance with the internal resistance R75 of the integrated circuit 181 and the currents $I_{60}$ and $I_{61}$ of the current sources 182, 183 and 186.

In this case, while the external resistance R71 of the output stage has no temperature dependence, the internal resistance R75 has the temperature dependence, therefore a temperature dependent characteristic is capable of appearing on the general gain G in accordance with working temperature of the integrated circuit 181, however, the temperature dependent characteristic of the internal resistance R75 is negated by the current $I_{60}$ of the current sources 182 and 183 in inverse proportion to a temperature characteristic of the internal resistance.

Then, the current $I_{61}$ of the current source 186 has not a temperature dependent characteristic, therefore the general gain G of the integrated circuit 181 may be kept constant irrespective of a fluctuation of working temperature.

Meanwhile, when a frequency characteristic of the output circuit 180 is to be expanded further to a wide band, since the collector capacity $C_{ob}$ is fixed, a resistance value $R_{75}$ of the internal resistance R75 must be minimized, however, the product $R_{75} \cdot I_{60}$ of the resistance value $R_{75}$ and the current $I_{60}$ of the current sources 182, 183 sets a dynamic range of the input signal $V_{in}$, therefore it cannot be minimized independently.

Now, therefore, the frequency characteristic can further be expanded from minimizing the resistance value $R_{75}$ by increasing the current $I_{60}$.

However, such increase of current consumption may result generally in a chip temperature rise of the integrated circuit 181, therefore it is necessary that a radiation fin be connected to the integrated circuit, or a thermal resistance be reduced by enlarging a construction of the package itself.

However, in the case of this embodiment, if the reference voltage E53 with which to supply a base voltage to the external transistors Q181 and Q182 is stepped down to set and minimize an emitter potential $E_A$ of the transistors Q181 and Q182, then a power consumption W within the integrated circuit may be reduced as indicated by the following equation:

$$W = E_A \cdot 2I_{61} \qquad (15)$$

in case the output current $I_1$ increases, therefore a rise $\Delta T$ of working temperature will be minimized, and thus the wide-band output circuit can be enclosed in a normal package without providing a cooling body particularly therefore.

Further, a logical amplitude of the external resistance R71 can be taken largely from minimizing the emitter potential $E_A$ as described, therefore the dynamic range can be expanded furthermore.

Here, the reference supply E53 may be set within the range for the differential pair of the output stage and the current source 186 to operate both.

In this connection, in the case of this embodiment, it is conceived that the external transistors Q181 and Q182 will be provided within the integrated circuit with reference to the output terminals P60 and P61 of the integrated circuit 181, however, since the load capacity C applied to the output terminal P60 must be driven on the output voltage in this case, a frequency characteristic will deteriorate.

According to the above-described construction, a load capacity parasitic on the output terminal P60 of the integrated circuit 181 is driven on the collector current $I_{61} \pm i$ flowing into the integrated circuit 181 through the external resistance R71 and the external transistor Q181 in that order, and from extracting a voltage generated on the external resistance R71 by the collector current $I_{61} \pm i$ as the output voltage signal $V_{out8}$, a deterioration of the frequency characteristic due to the load capacity parasitic on the output terminal P60 can be removed, and thus the frequency characteristic can be expanded further to a high level as compared with the prior art one.

Besides, a driving voltage in the integrated circuit 181 can be stepped down, thus power on the output circuit 180 is consumed much by the transistor Q181 fitted outside, and temperature of the integrated circuit 181 at the time of operation arises less comparatively, and hence the wide-band output circuit can be mounted within a chip free from a cooling body.

Further, with the signal output as a current output, the integrated circuit 181 may effectively avoid a possibility of oscillating due to an influence of the load capacity parasitic on the output terminal P60.

In the above-described embodiment, the description has referred to the case where the driving power flow the Gilbert type operational amplifier circuit and the differential amplifier circuit provided within the integrated circuit 181 and the driving power supplied to bases of the external transistors Q181 and Q182 are set separately, however, the present invention is not necessarily limited thereto, and hence is applicable to the case where the supply voltage is supplied by a common driving power.

Thus, a dynamic range of the output signal can be expanded furthermore.

Besides, in the above-described embodiment, the description has referred to the case where the integrated circuit 181 generated an output in-phase with the input signal $V_{in}$, however, the present invention is not necessarily limited thereto, and is applicable to the case where an anti-phase output is extracted from the output terminal P61 and also to the case where an in-phase output and a anti-phase output are generated both.

Further in the above-described embodiment, the description has referred to the case where the wide-band output circuit is constructed as shown in FIG. 12, however, the present invention is not necessarily limited thereto, and is also applicable extensively to the case where an output from the integrated circuit 181 functions as the current output.

As described above, according to the present invention, a third and a fourth transistors are cascaded externally with a first and second transistors connected to output terminals by collectors each through the output terminals, and a load capacity parasitic on the output terminals of the integrated circuit is driven by a collector current flowing to the third transistor, therefore an influence of the load capacity can be neglected, and thus an operating zone can be expanded further to a high frequency band as compared with a prior art one.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A wide-band amplifier circuit, comprising:
    differential amplification means constructed of a first and a second transistors, collectors being connected to a first and a second output terminals each, and driven by an input voltage supplied to bases;
    a third transistor provided externally of an integrated circuit with said differential amplification means mounted thereon, having the base connected to a direct current power terminal, and cascaded to said first transistor through said first output terminal;
    a fourth transistor connected to said third transistor, and also cascaded to said second transistor through said second output terminal;
    an external load resistance connected to a collector of said third transistor, and transforming a collector current supplied from said third transistor to said first transistor through said first output terminal into an output voltage; and
    a load capacity parasitic on said first output terminal being driven by said collector current.

2. The wide-band amplifier circuit according to claim 1, said differential amplification means operating on supply voltage supplied to said direct current power terminal as a driving power.

3. The wide-band amplifier circuit according to claim 1, wherein a current source with less characteristic fluctuation by temperature is connected to common emitters of said first and second transistors.

4. A wide-band amplifier circuit, comprising:
    a differential input stage for inputting an input signal from a differential input end and outputting from a differential output and as an in-phase output signal and an anti-phase output signal;
    a first differential output stage for inputting said in-phase output signal and anti-phase output signal to first and second transistors, and outputting a first differential output from a first load resistance connected to a collector of the first or second transistor;
    a second differential output stage for inputting said in-phase output signal and anti-phase output signal to third and fourth transistors, and outputting a second differential output in-phase with said first differential output from a second load resistance connected to a collector of the third or fourth transistor;
    a first buffer transistor for supplying said first differential output to said second load resistance, and superposing the first differential output on said second differential output;
    a third differential output stage for inputting said in-phase output signal and anti-phase output signal to fifth and sixth transistors, and supplying an output current to an output end from the fifth or sixth transistor; and a second buffer transistor for supplying a combined output voltage of said first and second differential outputs which is anti-phase with said output current to the output end: wherein said output end being subjected to a push-pull drive.

5. The wide-band amplifier circuit according to claim 4, wherein said first, second and third differential output stage are provided with a seventh, an eighth, a ninth, a tenth, an eleventh and a twelfth transistors cascaded with said first, second, third, fourth, fifth and sixth transistors.

6. The wide-band amplifier circuit according to claim 4, further comprising:

a fourth differential output stage for inputting said in-phase output signal and anti-phase output signal to seventh and eighth transistors, and supplying a second output current to a second output end from the seventh or the eighth transistor; and a third buffer transistor connected to said second buffer transistor in Darlington connection, and supplying the combined output voltage of said first and second differential outputs which is anti-phase with said second output current to the second output end; wherein said second output end being subjected to a push-pull drive.

7. The wide-band amplifier circuit according to claim 6, wherein said first, second, third and fourth differential output stages comprise means connecting a first, a second, a third and a fourth resistances to common emitters of said first and second, third and fourth, fifth and sixth, seventh and eighth transistors respectively, means supplying an output current to said first and second, third and fourth, fifth and sixth, seventh and eighth transistors.

8. The wide-band amplifier circuit according to claim 4, further comprising:

a fourth differential output stage for inputting said in-phase output signal and anti-phase output signal to seventh and eighth transistors, and supplying a second output current to a second output end from the seventh or the eighth transistor; and a third buffer transistor connected to said second buffer transistor in Darlington connection, and supplying the combined output voltage of said first and second differential outputs which is anti-phase with said second output current to the second output end: wherein said first, second, third and fourth differential output stages having a ninth, a tenth, an eleventh, a twelfth, a thirteenth, a fourteenth, a fifteenth and a sixteenth transistors cascaded with said first, second, third, fourth, fifth, sixth, seventh and eighth transistors; and said second output end being subjected to a push-pull drive.

* * * * *